United States Patent [19]

Mahmud

[11] Patent Number: 4,804,870
[45] Date of Patent: Feb. 14, 1989

[54] NON-INVERTING, LOW POWER, HIGH SPEED BOOTSTRAPPED BUFFER

[75] Inventor: Syed T. Mahmud, Los Gatos, Calif.

[73] Assignee: Signetics Corporation, Sunnyvale, Calif.

[21] Appl. No.: 148,185

[22] Filed: Jan. 26, 1988

Related U.S. Application Data

[63] Continuation of Ser. No. 083,919, Aug. 7, 1987, abandoned, which is a continuation of Ser. No. 750,947, Jul. 1, 1985, abandoned.

[51] Int. Cl.[4] .................. H03K 17/06; H03K 19/017
[52] U.S. Cl. ................................. 307/482; 307/578; 307/270; 307/449
[58] Field of Search ............... 307/482, 578, 270, 449

[56] References Cited

U.S. PATENT DOCUMENTS

| | | | |
|---|---|---|---|
| 4,063,117 | 12/1977 | Laugeren et al. | 307/270 |
| 4,443,715 | 4/1984 | Fox | 307/578 |
| 4,449,066 | 5/1984 | Aoyama et al. | 307/578 |
| 4,484,092 | 11/1984 | Campbell, Jr. | 307/270 |
| 4,491,748 | 1/1985 | Chappell et al. | 307/578 |
| 4,587,447 | 5/1986 | Baehring | 307/578 |

Primary Examiner—David Hudspeth
Attorney, Agent, or Firm—James J. Cannon

[57] ABSTRACT

A non-inverting low power high speed bootstrapped buffer having a depletion mode FET device which senses a rising voltage triggers the bootstrap of a high capacitance node isolated from the input. Heavy output loading can be isolated from the bootstrap node. High resistance devices are used to make a fully static circuit.

5 Claims, 3 Drawing Sheets

FIG.I
PRIOR ART

NON-INVERTING, LOW POWER, HIGH SPEED BOOTSTRAPPED BUFFER

This is a continuation of application Ser. No. 83,919, filed Aug. 7, 1987, now abandoned, which is a continuation of Ser. No. 750,947, filed July 1, 1985, now abandoned.

BACKGROUND OF THE INVENTION

1. Field of the Invention

The present invention pertians to a non-inverting low power, high speed boostrapped buffer for use in address decoders, word line drivers and similar circuits. The circuit features a very fast rise time using low static power, thereby minimizing power dissipation.

2. Description of Related Art

The closest prior art circuit known to the inventor was disclosed in the Proceedings of the 1983 IEEE International Solid State Circuits Conference, pages 104 ff. Therein is disclosed a 5ns 4KX1 NMOS static RAM which uses a self-restoring bootstrapped driver circuit to provide fast word line access with low deselect power dissipation. That circuit uses an inverter to invert its input. Hence, its input voltage must rise to the inverter threshold. The circuit of the present invention does not require an inverter at the input stage, thus providing less delay and using less power since its input circuit has to rise only to the threshold voltage of the input device before the buffer fires.

SUMMARY OF THE INVENTION

The invention pertains to a non-inverting, low power, high speed bootstrapped buffer which is used to drive high capacitance nodes with very fast rise times. Power dissipation is a significant problem in many integrated circuits. The circuit of the present invention provides a very fast rise time with low static power. It provides a new way of isolating the bootstrap node by sensing the rising input voltage through a depletion mode FET device. When the input voltage is low a depletion mode transistor precharges a capacitor. As the input voltage rises, a node is cut off so that it can be bootstrapped. When the input voltage reaches a threshold, the node is bootstrapped through the capacitor and rises higher than $V_{DD}$ so that the output of the circuit swings to $V_{DD}$. The circuit may be adapted to heavier loads by isolating the bootstrapping node from the output through the use of an extra buffer. This also permits faster rise times. In the preferred embodiment, a fully static non-inverting circuit, the inverter is replaced with a NOR gate whose output remains low even after the isolated bootstrap node has discharged because of the leakage currents, provided the input remains high. With all transistors off the output will stay high when the input is high through a high resistance sustaining transistor at the output node.

DESCRIPTION OF THE PREFERRED EMBODIMENTS

Figure 1:
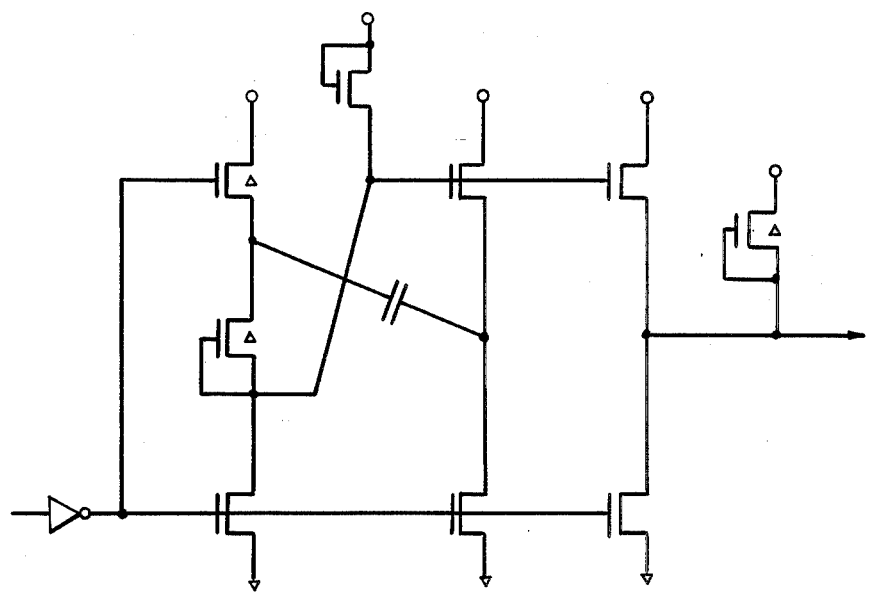
FIG. 1 is a typical prior art circuit.

In the drawings, a triangle in the transistor symbol denotes a depletion mode device.

Figure 2:
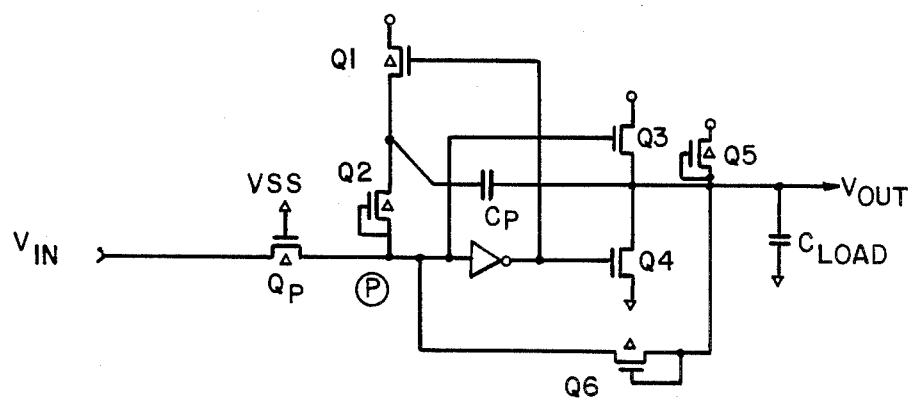
FIG. 2 is a first embodiment of the circuit of the present invention for low capacitance loads.

FIG. 1 is a schematic drawing of a prior art circuit based upon FIG. 2 of the reference cited above.

FIG. 2 is a non-inverting, low power, high speed buffer for moderate capacitive loads. When $V_{IN}$ is low, the transistor Qp is on, the inverter output is high, Q1 is on and capacitor Cp is precharged through Q1 to $V_{DD}$. The gate of Q4 is high, pulling $V_{OUT}$ low. Q3 is cut off because its gate is at 0 volts.

As $V_{IN}$ rises to reach $|V_{TQP}|$, Qp is cut off, thus isolating the node P so that it can be bootstrapped. As P rises, the output of the inverter goes low and cuts off both Q1 and Q4. At the same time Q3 turns on the bootstraps node P through capacitor Cp and Q2. Since the Cp bootstrap started at $V_{DD}$, node P rises much higher than $V_{DD}$ so that $V_{OUT}$ swings to $V_{DD}$. The advantage of Qp is that $V_{IN}$ has to rise to only the threshold voltage of Qp before the buffer fires.

Q5 and Q6 are high resistance devices which make this circuit fully static for low frequency signals. These two devices are optional.

Figure 3:
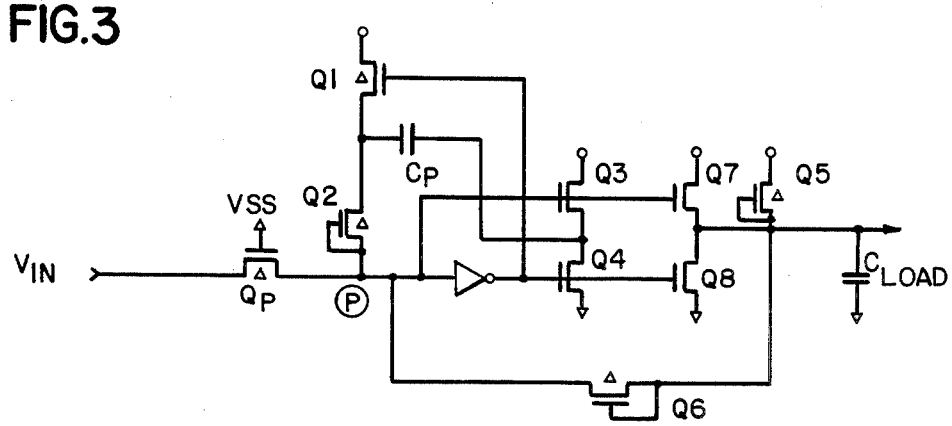
FIG. 3 is a second embodiment of the circuit of the present invention for high capacitance loads.

FIG. 3 shows an embodiment of the circuit of FIG. 2 for heavier loads. In this embodiment the bootstrapping node on the drain of Q4 is isolated from the heavy output loading. The output load is driven by a buffer of Q7 and Q8.

Figure 4:
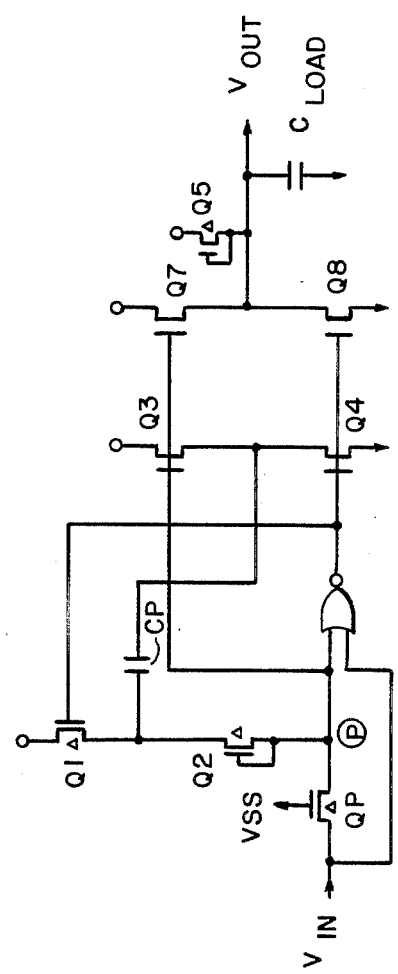
FIG. 4 is the preferred embodiment of the fully-static, non-inverting, low power, high speed bootstrapped buffer of the present invention.

FIG. 4 illustrates a preferred embodiment incorporating features of the previous embodiments, and is particularly preferred for fully static operation of the circuit.

In this embodiment a NOR gate replaces the inverter of FIGS. 2 and 3. The NOR gate has its second input coming from $V_{IN}$. As long as $V_{IN}$ is high, the output of the NOR gate remains low even if node P has discharged. This prevents transistors Q4 and Q8 from turning on. The output is never driven low due to the discharge of node P. If node P discharges, it will cut off transistors Q3 and Q7, but the output $V_{OUT}$ stays high due to the sustaining device Q5 which is a high resistance device. The high capacitance load has its drivers isolated from the bootstrap loop and node P can have a fast rise time through Cp. The input can also be a high capacitance node because the input has to rise only to the threshold voltage of Qp before the buffer fires. The replacement of the inverter of previous embodiments by a NOR gate makes static operation simpler.

The preferred embodiment of FIG. 4 provides for feeding the bootstrap back using a passive device Cp. The depletion device Qp provides a novel way of making the circuit non-inverting and isolates the node P from $V_{IN}$ so that node P can be bootstrapped. The use of the NOR gate makes the circuit a fully static buffer. $V_{IN}$ does not have to rise to the full power supply voltage, but only to the threshold voltage of Qp. Consequently, this circuit has less power dissipation because it provides a fast rise time with low static power.

I claim:

1. A non-inverting low power high speed fully static bootstrapped buffer having an input terminal and an output terminal, said buffer comprising:

a first depletion mode transistor having a gate connected to a supply voltage source $V_{SS}$, said first transistor coupling a signal at said input terminal of said buffer to an internal node of said buffer;

a precharge capacitor coupled to a voltage source $V_{DD}$ and said internal node;

a second depletion mode transistor having a gate, said second depletion mode transistor coupling said voltage source $V_{DD}$ to said capacitor;

a NOR gate having a first input coupled to said internal node and a second input coupled to said input terminal;

said NOR gate having an output which is coupled to said gate of said second depletion mode transistor, so that said capacitor is charged when the voltage of said signal at said input terminal is low;

said first depletion mode transistor having a threshold voltage lower than said supply voltage $V_{SS}$ such that said first transistor is switched off when its threshold voltage is reached, thereby isolating said internal node from said input terminal;

means to bootstrap said internal node through said capacitor when the voltage of said input signal exceeds said threshold voltage;

whereby said internal node is charged by said precharge capacitor and rises above said voltage of said input signal and above $V_{DD}$ to drive a high capacitance load; and means for coupling said internal node to said high capacitance load at said output terminal, while isolating said bootstrap means from said high capacitance load.

2. In a two-state buffer circuit having an input terminal and an output terminal of the type which comprises: bootstrappng means, which include a capacitor which is precharged when the input terminal is in a first logic state and bootstraps an output of the buffer circuit to an internal node to increase operating speed when the input terminal switches from the first logic state to a second logic state, in combination with a transistor whch is biased to isolate the input terminal from the internal node whenever the input terminal is in the second logic state; the improvement comprising NOR gate means having a first input connected to the input terminal, a second input connected to the internal node, and an output connected to control the state of the output terminal so that the output terminal is statically maintained in the second state when the input terminal is in the second state.

3. The circuit of claim 2 wherein the transistor is a depletion mode FET.

4. The circuit of claim 2 further comprising driver means; having an input connected to the output of the NOR gate means, a first output connected to the output terminal, and a second output connected to the capacitor; which isolate the bootstrapping means from capactive loads at the output terminal.

5. The circuit of claim 3 wherein the bootstrapping means further comprise an additional depletion mode FET having a source-drain conduction path connecting a source of bias voltage to the capacitor and a gate electrode which electrode is connected to the output of the NOR gate and controls the source-drain conduction path to precharge the capacitor when the input terminal is in the first logic state.

* * * * *